(12) United States Patent
Chen et al.

(10) Patent No.: US 9,812,405 B2
(45) Date of Patent: Nov. 7, 2017

(54) SEMICONDUCTOR PACKAGE AND MANUFACTURING METHOD OF THE SAME

(71) Applicant: TAIWAN SEMICONDUCTOR MANUFACTURING COMPANY LTD., Hsinchu (TW)

(72) Inventors: Guan-Yu Chen, Hsinchu (TW); Yu-Wei Lin, New Taipei (TW); Tin-Hao Kuo, Hsinchu (TW); Chen-Shien Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/223,371

(22) Filed: Jul. 29, 2016

(65) Prior Publication Data

US 2016/0336281 A1 Nov. 17, 2016

Related U.S. Application Data

(62) Division of application No. 14/517,026, filed on Oct. 17, 2014, now Pat. No. 9,431,351.

(51) Int. Cl.
*H01L 23/00* (2006.01)
*H01L 23/498* (2006.01)
(Continued)

(52) U.S. Cl.
CPC ........ *H01L 23/562* (2013.01); *H01L 21/4853* (2013.01); *H01L 21/4857* (2013.01); *H01L 22/12* (2013.01); *H01L 22/20* (2013.01); *H01L 23/49822* (2013.01); *H01L 23/49827* (2013.01); *H01L 23/49838* (2013.01); *H01L 23/49894* (2013.01); *H01L 24/81* (2013.01);
(Continued)

(58) Field of Classification Search
CPC ... G01B 11/14; G01B 11/161; H01L 21/4853; H01L 21/4857; H01L 23/49894
USPC ............................................................. 438/7
See application file for complete search history.

(56) References Cited

U.S. PATENT DOCUMENTS 7,564,115 B2 7/2009 Chen et al.
7,633,165 B2 12/2009 Hsu et al.
(Continued)

OTHER PUBLICATIONS

Office Action dated Sep. 9, 2016 issued by the Taiwan Intellectual Office for corresponding Taiwan application 104133346.
(Continued)

*Primary Examiner* — Tuan Nguyen
(74) *Attorney, Agent, or Firm* — WPAT, P.C., Intellectual Property Attorneys; Anthony King

(57) ABSTRACT

The present disclosure provides a method for manufacturing a semiconductor package. The method includes (1) determining a die warpage value under a predetermined temperature range; (2) determining a difference between a density of a top metal and a density of a bottom metal of a substrate according to the die warpage value; and (3) joining the die and the substrate under the predetermined temperature range. The top metal includes all metal layers overlying a middle layer, and the bottom metal includes all metal layers underlying the middle layer. The middle layer includes a core or a metal layer.

20 Claims, 18 Drawing Sheets

(51) Int. Cl.
*H01L 21/66* (2006.01)
*H01L 21/48* (2006.01)
*H01L 25/065* (2006.01)

(52) U.S. Cl.
CPC ......... *H01L 23/49811* (2013.01); *H01L 24/13* (2013.01); *H01L 24/16* (2013.01); *H01L 24/17* (2013.01); *H01L 25/0655* (2013.01); *H01L 2224/131* (2013.01); *H01L 2224/16227* (2013.01); *H01L 2224/16235* (2013.01); *H01L 2224/17106* (2013.01); *H01L 2224/814* (2013.01); *H01L 2224/81191* (2013.01); *H01L 2224/81424* (2013.01); *H01L 2224/81444* (2013.01); *H01L 2224/81447* (2013.01); *H01L 2224/81455* (2013.01); *H01L 2224/81815* (2013.01); *H01L 2924/15311* (2013.01); *H01L 2924/3511* (2013.01)

(56) References Cited

U.S. PATENT DOCUMENTS

| | | | |
|---|---|---|---|
| 7,825,024 B2 | 11/2010 | Lin et al. | |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,802,504 B1 | 8/2014 | Hou et al. | |
| 8,803,292 B2 | 8/2014 | Chen et al. | |
| 8,803,316 B2 | 8/2014 | Lin et al. | |
| 2008/0048303 A1* | 2/2008 | Amagai | H01L 23/3128 257/668 |
| 2014/0001645 A1 | 1/2014 | Lin et al. | |
| 2014/0021617 A1* | 1/2014 | Lu | H01L 21/76898 257/758 |
| 2014/0110847 A1 | 4/2014 | Tseng et al. | |
| 2014/0225258 A1 | 8/2014 | Chiu et al. | |
| 2014/0252572 A1 | 9/2014 | Hou et al. | |
| 2015/0287697 A1 | 10/2015 | Tsai et al. | |
| 2015/0348872 A1 | 12/2015 | Kuo et al. | |

OTHER PUBLICATIONS

Search report dated Sep. 9, 2016 issued by the Taiwan Intellectual Office for corresponding Taiwan application 104133346.

\* cited by examiner

| Device Die | | Carrier Substrate | |
|---|---|---|---|
| Area (mm$^2$) | Thickness (Mil) | Warpage at 240-270°C (μm) | Top metal and bottom metal Density Difference | Warpage at 240-270°C (μm) |
| 144 | 4 | -56 | 18.1% | -56 |
| | 6 | -37 | 12.8% | -37 |
| | 8 | -28 | 10.3% | -28 |
| 100 | 4 | -39 | 13.4% | -39 |
| | 6 | -26 | 9.8% | -26 |
| | 8 | -20 | 8.1% | -20 |

FIG. 8

SEMICONDUCTOR PACKAGE AND MANUFACTURING METHOD OF THE SAME

CROSS-REFERENCE

This application is a divisional of U.S. patent application Ser. No. 14/517,026, filed Oct. 17, 2014, and claiming priority thereto.

BACKGROUND

Integrated circuits are typically formed on a substrate such as a semiconductor wafer. Bonding bumps (bump-on-trace, or BOT) are part of the interconnecting structure in an integrated circuitry. A bump provides an interface to an integrated circuit device through which an electrical connection to the device may be made. Conventional techniques may be used to provide a connection from a package terminal to an integrated circuit using the thermocompression or thermosonic wire bonding and other techniques known in the art.

Chip interconnection techniques such as the flip chip, also known as Controlled Collapse Chip Connection or its acronym, C4, interconnect semiconductor devices to external circuitry with solder bumps that have been deposited onto the chip output contacts. The solder bumps are deposited on the chip pads on the top side of the wafer during the final wafer processing step. In order to mount the chip to external circuitry (e.g., a circuit board or another chip or wafer), the chip is flipped over so that its top side faces down, and its contacting pads overlay with matching pads on the external circuitry, and then the solder is flowed between the flipped chip and the substrate supporting the external circuitry to complete the interconnect. This is in contrast to wire bonding, in which the chip is mounted upright and wires are used to interconnect the chip pads to external circuitry. The resulting completed flip chip package is much smaller than a traditional carrier based system, because the chip sits right on the circuit board. When the interconnect wires are much shorter, the inductance and resistive heat are greatly reduced. Therefore, flip chip allows higher-speed devices.

BOT structures may sometimes suffer from peeling-off or delamination. For example, during processing, undercut regions may form on the traces. These undercut regions coupled with stress generated by a mismatch between the coefficient of thermal expansion (CTE) of the device die and the CTE of the package substrate may increase the likelihood of peeling-off or delamination in the resulting package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 8 shows a table listing parameters of a device die and a carrier substrate, in accordance with some embodiments of the present disclosure.

DETAILED DESCRIPTION

Figure 1:
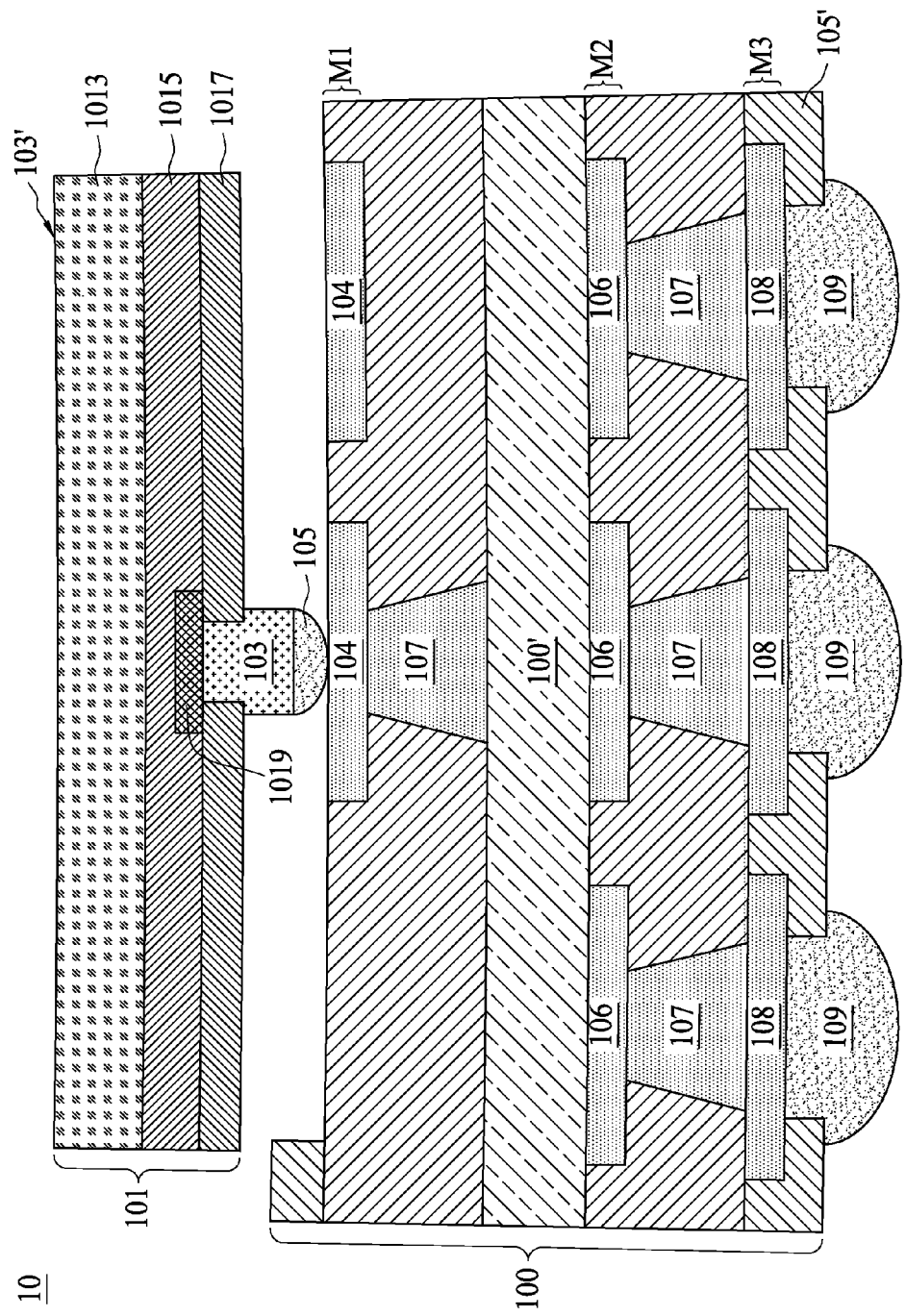
FIG. 1 shows a cross sectional view of a semiconductor package, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the trend of achieving finer pitch in a BOT package, the metal bump size inevitably shrinks in order to decrease the pitch between adjacent metal bumps. While the dimension of the metal bump decreases, the volume of the solder materials applied to the metal bump so as to electrically connect the metal bump and the metal trace on a carrier substrate also decreases. Lower solder material volume contributes to cold joint failure. Alternatively stated, the problem that the electrical connection between the metal bump and the metal trace is not effectively overlapped or is not electrically connected becomes more serious along with the shrinkage of the bump pitch.

In a scenario during a reflow operation, both the solder ball planted on the device die and the solder paste patterned on the carrier substrate melt and become a joint. Because the bending of the device die and that of the carrier substrate, the joint fractures and causes an open failure. The fracture can be anticipated to be most serious when the bending of the device die does not accord with the bending of the carrier substrate. For example, when the device die possesses a first warpage convention while the carrier substrate possesses an opposite warpage convention, the tensile stress pulls the two objects away from each other and thus causing the cold joint or open failure to occur.

Present disclosure provides a semiconductor package with fine metal bump pitch and low cold joint failure, and a method of manufacturing of said semiconductor package. The device die in some embodiments of the present disclosure has a first warpage convention. The carrier substrate in some embodiments of the present disclosure is controlled to possess the first warpage convention as in the device die. In some embodiments, the device die and the carrier substrate share an identical warpage convention, for example, a concave shape. The device die and the carrier substrate having the concave shape then joined at a predetermined temperature, for example, the reflow temperature.

The control of the carrier substrate so as to show a certain warpage convention is to control metal densities in a top layer and a bottom layer of the carrier substrate. The "metal density" of a top layer referred hereinafter is directed to an areal ratio between the metal trace on the top layer and the package size from a top view perspective. Similarly, the "metal density" of a bottom layer referred hereinafter is directed to an areal ratio between the metal trace on the bottom layer and the package size from a top view perspective. For example, the metal density can be expressed by the equation as follows:

Metal density$_i$=metal area$_i$/package size wherein in some embodiments, the metal area is the area occupied by copper trace, and the package size can be calculated by multiplying the width and the length of a rectangular or a square package. The subscript i noted in the above equation represents a predetermined layer of the carrier substrate. For example, the metal density of the first metal layer in proximity to a top surface 103' of the carrier substrate is about the metal area in the first metal layer divided by the package size. In some embodiments of the present disclosure, the metal density is defined as an average value of several metal layers, such as a "top metal" density or a "bottom metal" density. In the aforesaid cases, the average metal density is about a summation of the metal area in said several metal layers, divided by the package size, and further divided by the number of the metal layers summing up. Detailed calculation is demonstrated in the following embodiments.

Referring to FIG. 1, FIG. 1 shows a cross sectional view of a semiconductor package 10, in accordance with some embodiments of the present disclosure. The semiconductor package 10 includes a carrier substrate 100 having a first warpage and a device die 101 having a second warpage. The first warpage and the second warpage illustrated in FIG. 1 are exaggerated for the sake of clarity. Warpage of a carrier substrate and a device die can be measured by suitable semiconductor metrology inspection systems. In FIG. 1, the device die 101 is positioned over the carrier substrate 100, electrically connected with the carrier substrate 100 through, for example, solder materials 105. A top surface 103' of the device die 101 possesses a measurable area. In some embodiments, the area of the top surface 103' of the device die 101 is greater than about 100 mm$^2$. For example, the device die 101 can be a 12 mm by 12 mm square shape, a 10 mm by 10 mm square shape or a 10 mm by 12 mm rectangular shape, from a top view perspective (not shown in FIG. 1). As shown in FIG. 1, the sign convention of the first warpage and the sign convention of the second warpage are identical. Alternatively stated, the first warpage and the second warpage both having a concave shape (i.e. a middle portion of the device die or the carrier substrate is lower than an edge portion of the same), and hence having a negative sign convention. In some embodiments, the value of the first warpage and the value of the second warpage are substantially identical. For example, a device die having a thickness of 4 mil possesses a warpage of about −56 μm measured under a predetermined temperature range, for example, 240 to 270 degrees Celsius, and the corresponding carrier substrate possesses a warpage of about −56 μm measured under the same predetermined temperature range.

In FIG. 1, the device die 101 includes at least a silicon substrate 1013 and a metallization layer 1015 having, for example, multiple metal layer composed of conductive metal traces, interconnects, and dielectric materials. A passivation layer 1017 covering the metallization layer 1015, and a conductive pad 1019 is exposed from the passivation layer 1017, electrically connected with a metal bump 103. Each of the silicon substrate 1013, the metallization layer 1015, and the passivation layer 1017 has different coefficient of thermal expansion. In some embodiments, before the joining of the device die 101 and the carrier substrate 100, the device die 101 (with or without a solder paste on the metal bump) alone undergoes a warpage inspection, a negative warpage convention is obtained in a specific temperature range, in other words, a middle portion (i.e. the portion in proximity to the metal bump 103 in FIG. 1) is lower than an edge portion (i.e. the portion away from the metal bump 103 in FIG. 1) in the specific temperature range. The warpage inspection is conducted with a temperature cycle ramping from room temperature to reflow temperature. In some embodiments, the reflow temperature is set to be in a range of from about 240 to 270 degrees Celsius. The negative warpage convention occurs at least in the range of from about 240 to 270 degrees Celsius.

In FIG. 1, the carrier substrate 100 includes at least several metal layers M1, M2, and M3. Metal layers (M1, M2, M3) electrically interconnected through metal vias 107. Accordingly, metal trace 104, which are parts of first metal layer M1, are electrically connected to metal pads 106, which are parts of second metal layer M2. The metal features in metal layers (M1, M2, M3) may include copper, aluminum, nickel, gold, or combinations thereof. In some embodiments, distribution of metal traces on each metal layers (M1, M2, M3) in the carrier substrate 100 is designed to possess a predetermined metal density. In some embodiments, the metal density in a top metal of the carrier substrate 100 is lower than the metal density in a bottom metal of the carrier substrate 100. Top metal referred herein is directed to metal layers in proximity to the top surface 103 of the carrier substrate 100, whereas the bottom metal is directed to metal layers in proximity to the surface 105' of the carrier substrate 100 planted with solder ball 109. As shown in FIG. 1, the carrier substrate 100 is composed of three metal layers (M1, M2, M3), sequentially from top to bottom. Furthermore, the carrier substrate 100 includes a middle layer 100' which can be a core layer or a metal layer. Under the condition that the middle layer is a core layer, the "top metal" of the carrier substrate 100 refers to the metal layers above the core layer, that is, the first metal layer M1. The "bottom metal" of the carrier substrate 100 refers to the metal layers below the core layer, that is, the second and the third metal layer M2 and M3. Under the condition that the middle layer is a metal layer, the "top metal" and the "bottom metal" of the carrier substrate 100 are classified differently when the total number of metal layer is an odd and an even number. In some embodiments, when a carrier substrate 100 possesses an odd number of metal layers, metal layers above the middle metal layer, as the second metal layer M2 shown in FIG. 1, is called top metal. Similarly, metal layers below the middle layer is called bottom metal.

Still referring to FIG. 1, the area occupied by metal trace 104 in the first metal layer M1 is smaller than the area occupied by metal trace 108 in the third metal layer M3. The definition of metal density is previously described and is not repeated here for simplicity. A difference between the top metal density and the bottom metal density can be adjusted to control the warpage behavior of the carrier substrate 100. In some embodiments, the top metal density and the bottom metal density are designed to have a difference of at least 8%, with the bottom metal density greater than the top metal density.

Figure 2B:
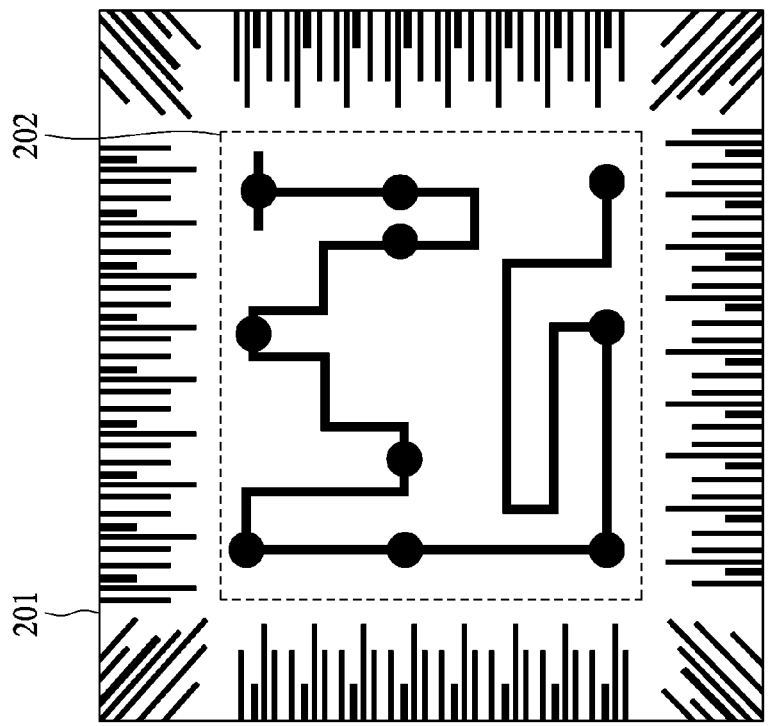
FIG. 2A and FIG. 2B show top views of different level of a carrier substrate, in accordance with some embodiments of the present disclosure.
Figure 2A:
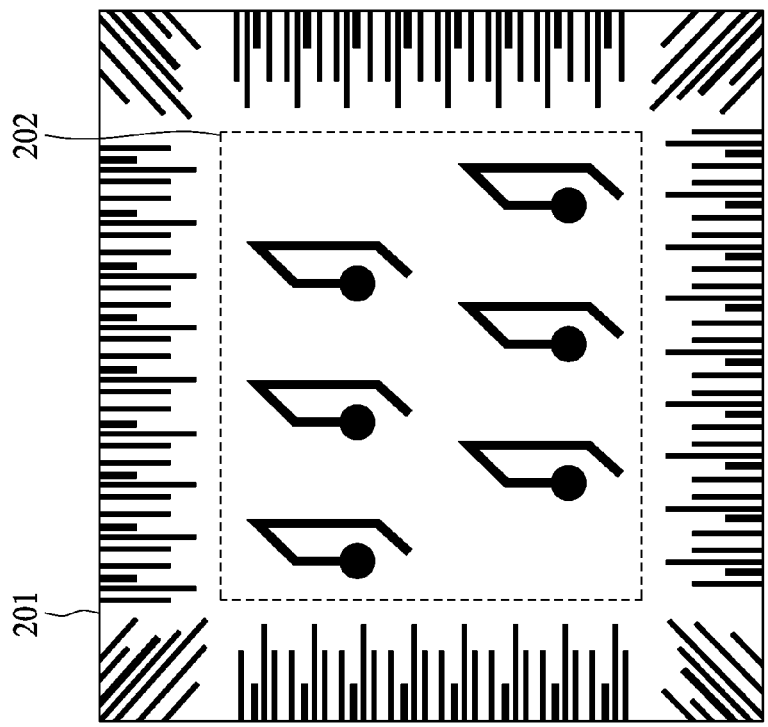

Referring to FIG. 2A and FIG. 2B, FIG. 2A shows a top view of one layer of the top metal, and FIG. 2B shows a top view of one layer of the bottom metal, in accordance with some embodiments of the present disclosure. Both metal traces in periphery region 201 and in the core region 202 are illustrated. As In some embodiments, the area occupied by the metal trace in FIG. 2B is greater than the area occupied by the metal trace in FIG. 2A. However, not every layer in the bottom metal possesses an area occupied by the metal trace greater than that in any layers of the top metal. It is the average area occupied by the metal trace in the bottom metal (which may include several metal layers) that is greater than the average area occupied by the metal trace in the top metal (which may include several metal layers).

Figure 3:
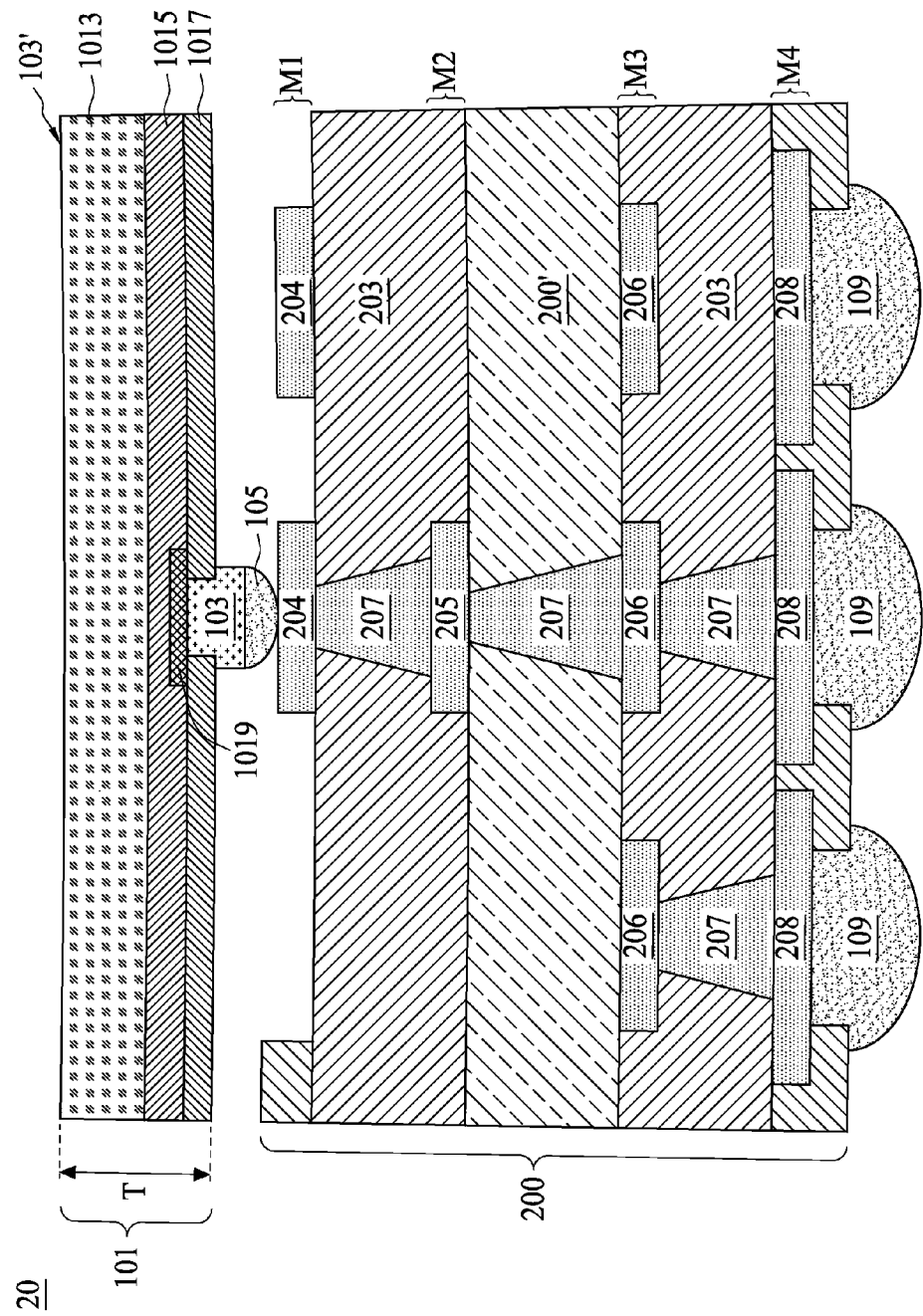
FIG. 3 shows a cross sectional view of a semiconductor package, in accordance with some embodiments of the present disclosure.

Referring to FIG. 3, a semiconductor package 20 with a carrier substrate 200 and a device die 101 is illustrated. Numeral labels in FIG. 3 that are identical to those in FIG. 1 are referred to the same object or its equivalent, and are not repeated here for simplicity. In FIG. 3, the carrier substrate 200 possesses a core layer 200', and the core layer 200' is sandwiched by metal layers (M1, M2, M3, M4). In some embodiments, the carrier substrate 200 is a semi-additive process substrate (SAP). The core layer 200' is composed of core dielectric layer including one or more material selected from epoxy, resin, glass fiber, molding compound, plastic (such as Polyvinylchloride (PVC), Acrylonitrile, Butadiene & Styrene (ABS), Polypropylene (PP), Polyethylene (PE), Polystyrene (PS), Polymethyl Methacrylate (PMMA), Polyethylene Terephthalate (PET), Polycarbonates (PC), Polyphenylene sulfide (PPS), or the combinations thereof). Metal vias 207 penetrate through the core layer 200', electrically connecting the second metal layer M2 and the third metal layer M3. In some embodiments as shown in FIG. 3, the metal layers M1 and M2 above the core layer 200' is called the top metal, whereas the metal layers M3 and M4 below the core layer 200 is called the bottom metal. The top metal density is the average of densities of all the metal layers in the top metal, which can be represented by a sum mansion of the area of the trace 205 and 204 in the top metal, divided by the package size, and further divided by the number (2) of metal layers in the top metal. Similarly, the bottom metal density is the average of densities of all the metal layers in the bottom metal, which can be represented by a sum mansion of the area of the trace 206 and 208 in the bottom metal, divided by the package size, and further divided by the number (2) of metal layers in the bottom metal.

As discussed previously, the density of the bottom metal is greater than the density of the top metal by at least 8%. In some embodiments, the difference can be about 10%. In FIG. 3, the device die 101 possesses a top surface 103' from which a die area can be measured. In some embodiments, the device die 101 has a die 100 mm$^2$. In other embodiments, the device die 101 has a die area of about 144 mm$^2$. In still other embodiments, the device die 101 has a die area of about 169 mm$^2$. However, the choice of the die area is not limited thereto, any die area greater than about 100 mm$^2$ is encompassed in the contemplated scope of the present disclosure. Also in FIG. 3, the device die 101 possess a thickness T of less than 10 mil. Warpage is most serious on a device die having a thickness less than about 10 mil. In some embodiments, the thickness T of the device die 101 is about 4 mil. In other embodiments, the thickness of the device die 101 is about 2 mil.

Figure 4:
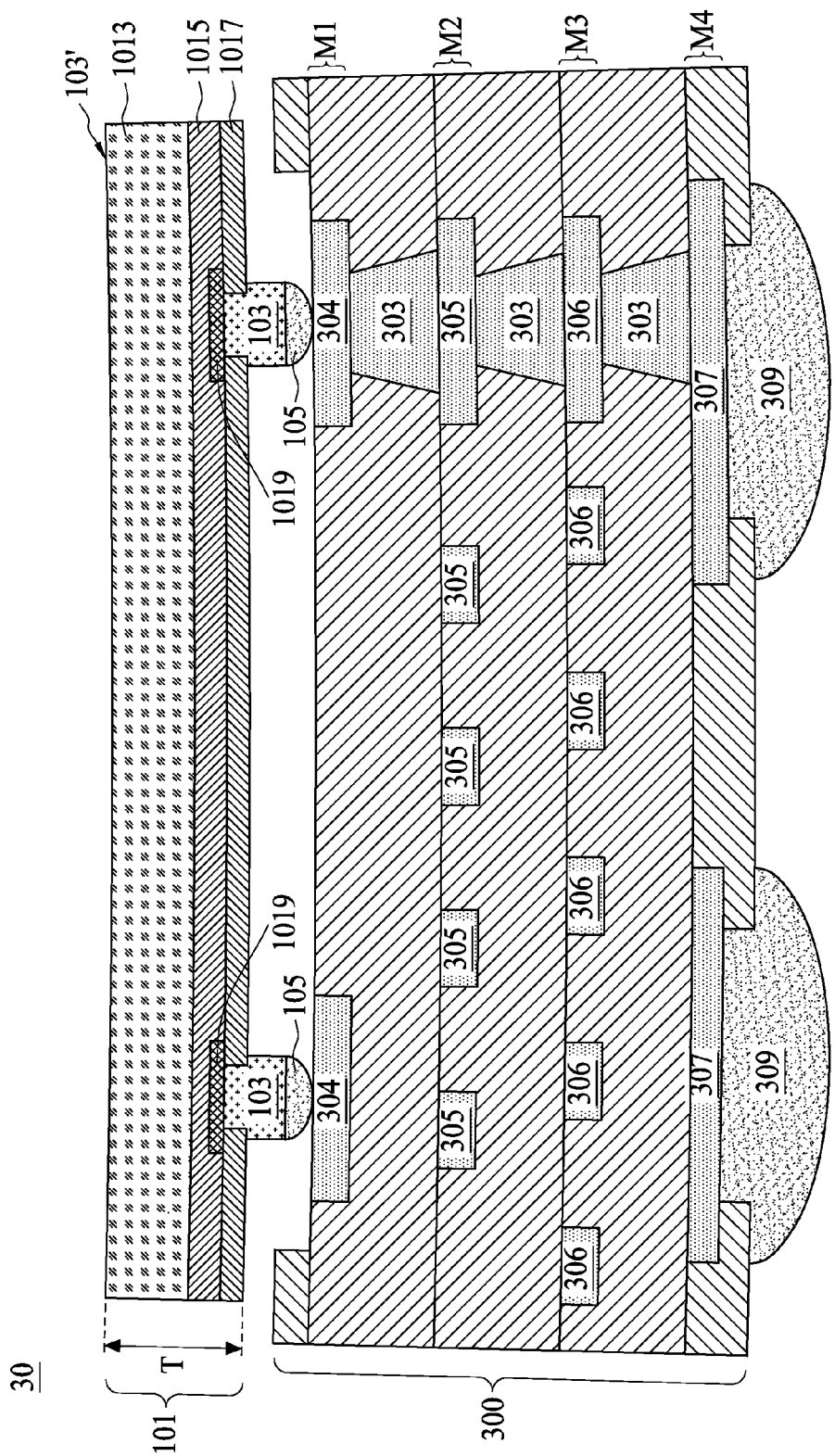
FIG. 4 shows a cross sectional view of a semiconductor package, in accordance with some embodiments of the present disclosure.

Referring to FIG. 4, a semiconductor package 30 with a carrier substrate 300 and a device die 101 is illustrated. Numeral labels in FIG. 4 that are identical to those in FIG. 1 and FIG. 3 are referred to the same object or its equivalent, and are not repeated here for simplicity. In FIG. 4, the carrier substrate 300 is a coreless substrate having an even number of metal layers (M1, M2, M3, M4). In some embodiments, the carrier substrate 300 is an embedded pattern plating (EPP) substrate. As discussed previously, the top metal of the carrier substrate 300 is metal layers M1 and M2, while the bottom metal is metal layers M3 and M4. The top metal density is the average area ratio occupied by metal traces 304 and 305 in metal layers M1 and M2, whereas the bottom metal density is the average area ratio occupied by metal traces 306 and 307 in metal layers M3 and M4.

As discussed previously, the density of the bottom metal is greater than the density of the top metal by at least 8%. In some embodiments, the difference can be about 13% in a 100 mm$^2$ device die and 18% in a 144 mm$^2$ device die, with a die thickness of 4 mil in both dies.

Figure 5:
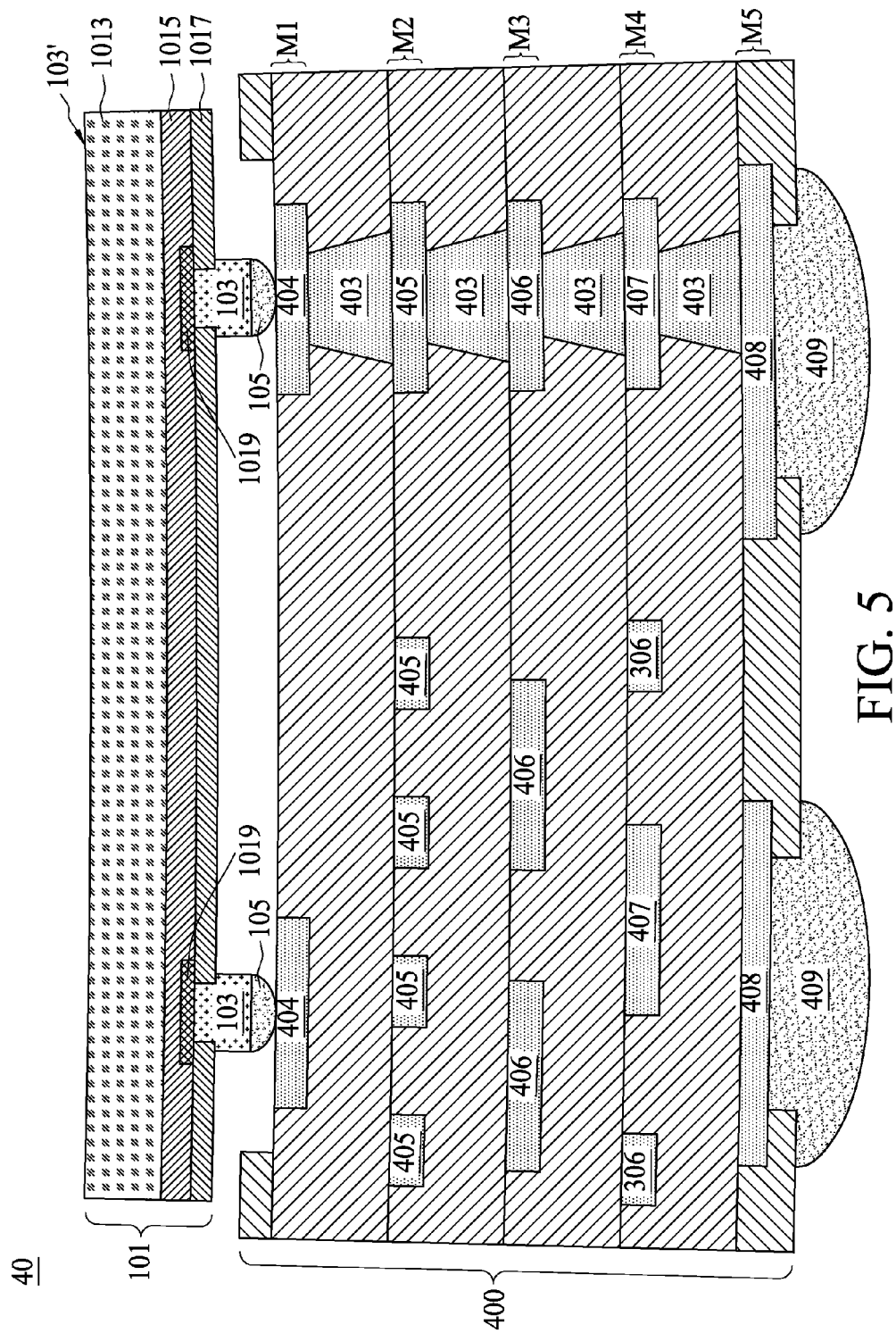
FIG. 5 shows a cross sectional view of a semiconductor package, in accordance with some embodiments of the present disclosure.

Referring to FIG. 5, a semiconductor package 40 with a carrier substrate 400 and a device die 101 is illustrated. Numeral labels in FIG. 5 that are identical to those in FIG. 1, FIG. 3, and FIG. 4 are referred to the same object or its equivalent, and are not repeated here for simplicity. In FIG. 5, the carrier substrate 400 is a coreless substrate having an odd number of metal layers (M1, M2, M3, M4, M5). In some embodiments, the carrier substrate 400 is an embedded pattern plating (EPP) substrate. As discussed previously, the top metal of the carrier substrate 400 is metal layers M1 and M2, while the bottom metal is metal layers M4 and M5. The top metal density is the average area ratio occupied by metal traces 404 and 405 in metal layers M1 and M2, whereas the bottom metal density is the average area ratio occupied by metal traces 407 and 408 in metal layers M4 and M5.

Figure 6:
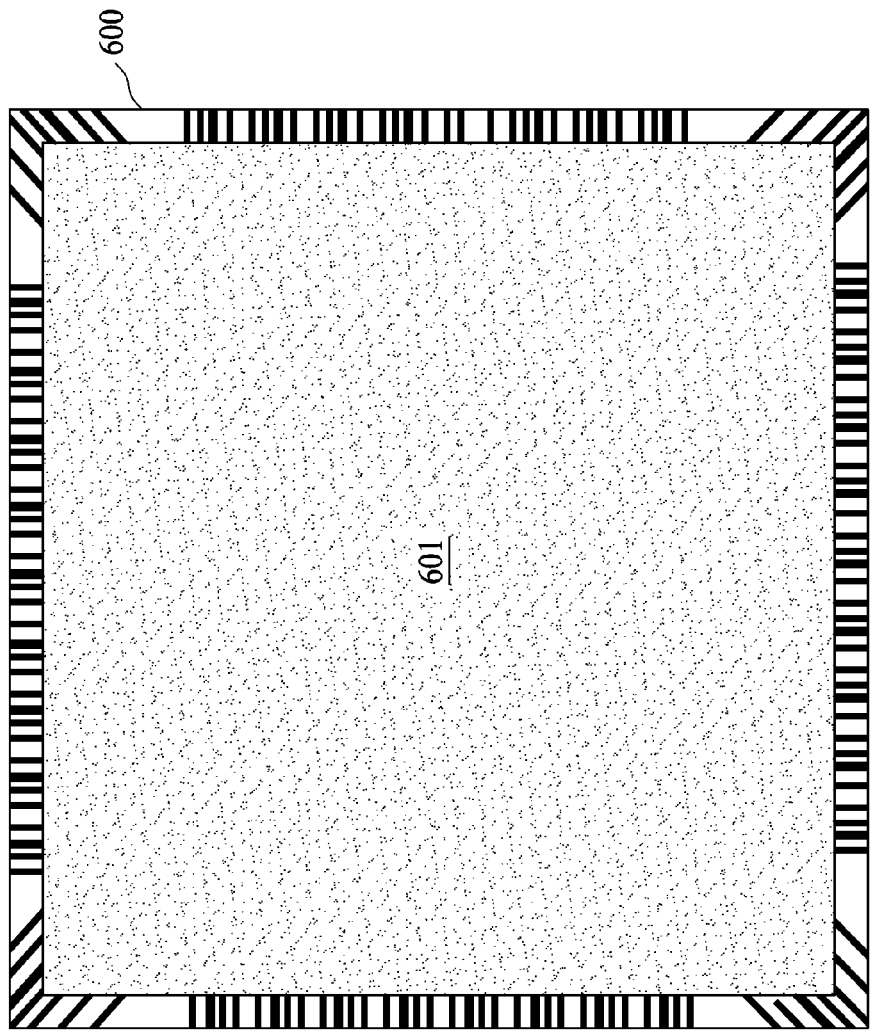
FIG. 6 shows a top view of a semiconductor package, in accordance with some embodiments of the present disclosure.

Referring to FIG. 6, FIG. 6 shows a top view of a semiconductor package, in accordance with some embodiments of the present disclosure. In some embodiments, the device die 106 over the carrier substrate can possess various die areas and various die thickness. For example, device die 601 has a surface area of about 100 mm² and a thickness of about 4 mil. In other embodiments, a plurality of device dies (not shown in FIG. 6) having different surface areas and different thicknesses are disposed over the carrier substrate 600.

Figure 7:
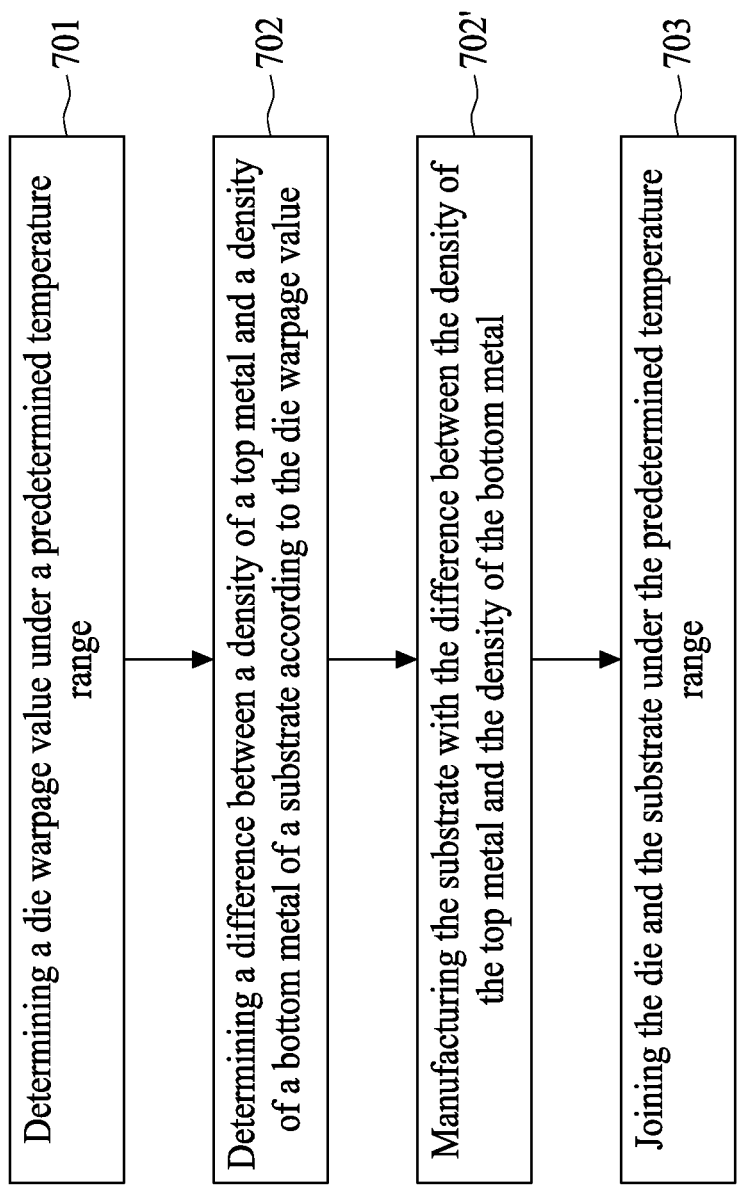
FIG. 7 shows a method for manufacturing a semiconductor package, in accordance with some embodiments of the present disclosure.

Referring to FIG. 7 and FIG. 8, FIG. 7 shows a method for manufacturing a semiconductor package, and FIG. 8 shows a table listing parameters of a device die and a carrier substrate, in accordance with some embodiments of the present disclosure. In operation 701, a warpage value of a device die is determined under a predetermined temperature range. The Warpage column in the table of FIG. 8 shows the warpage values obtained by suitable warpage inspection metrology under a temperature range of from about 240 to about 270 degrees Celsius. Note the warpage value varies according to the area and thickness of the device die. In some embodiments, the warpage value of a device die is obtained under a temperature cycle measurement.

In operation 702, a difference between a density of a top metal and a density of a bottom metal of a carrier substrate is determined based on the warpage value of the device die. As shown in FIG. 8, the Warpage column under carrier substrate is matched with the Warpage column under device die. To achieve a certain warpage value, the top metal density and the bottom metal density can be designed to match specific warpage behavior. In some embodiments, the difference between the top metal density and the bottom metal density (hereinafter the "density difference") can be adjusted to achieve a predetermined warpage value under certain temperature range. The density difference is obtained by subtracting the density of the bottom metal by the density of the top metal. For example, for a device die having an area of 144 mm² and a thickness of 6 mil, the measured warpage value under the temperature range of from about 240 to about 270 degrees Celsius is about −37 μm. The corresponding carrier substrate carrying the device die can be designed to have a density difference of about 12.8%. Because the predetermined warpage value of the carrier substrate and the density difference are correlated, in some embodiments, the density difference can be obtained thorough simulation operation.

In an optional operation 702', the carrier substrate is manufactured according to the density difference. For example, the greater warpage value is required, the more pronounced the difference between the top metal density and the bottom metal density. The corresponding metal routing is individually designed in each metal layer of the carrier substrate in order to achieve the predetermined density difference. In some embodiments, the carrier substrate is a semi-additive process (SAP) substrate, a coreless embedded pattern plating (EPP) substrate with odd or even numbers of metal layers, or the combinations thereof.

In operation 703, the device die and the carrier substrate is joined under the predetermined temperature. In some embodiments, the carrier substrate and the device die is joined around the reflow temperature, for example, from about 240 to about 270 degrees Celsius. When the reflow temperature is achieved, the device die and the carrier substrate both demonstrate identical sign convention, and in some embodiments, the substantially identical warpage value.

Referring to FIG. 7, in some embodiments, operations 701, 702, 702', and 703 may not be performed by the same entity. For example, the measurement of device die warpage value (701), the determination of density difference in the carrier substrate (702), and joining the device die and the carrier substrate under the predetermined temperature (703) can be performed by a semiconductor manufacturing foundry, while the manufacturing of the carrier substrate having predetermined density difference (702') can be performed by a carrier substrate supplier to the semiconductor manufacturing foundry.

Figure 9A:
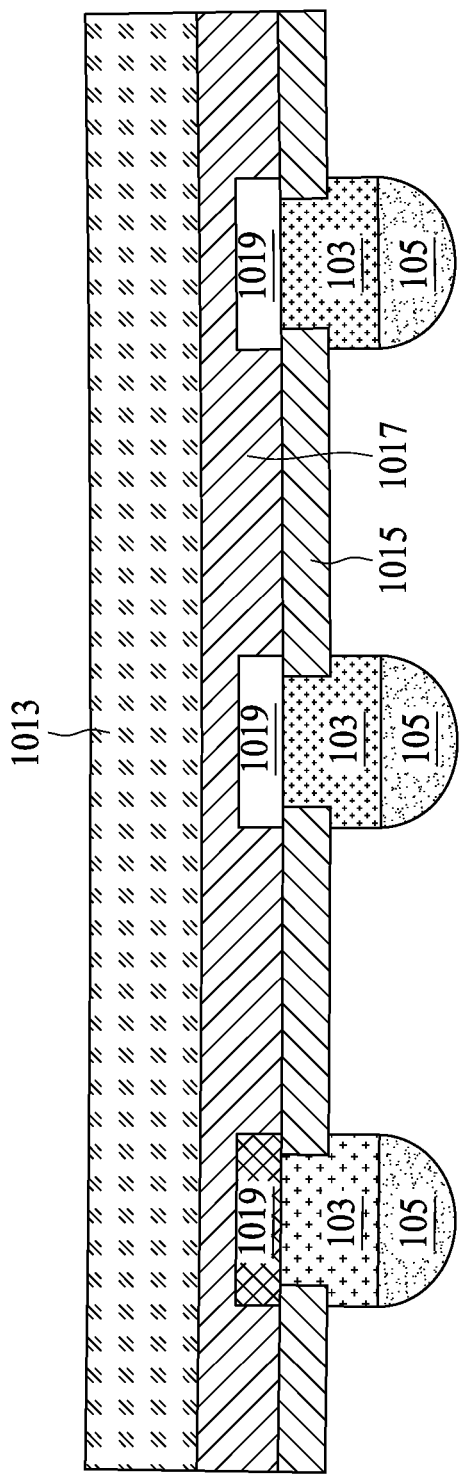
FIG. 9A shows a cross sectional view of a device die, in accordance with some embodiments of the present disclosure.
Figure 9B:
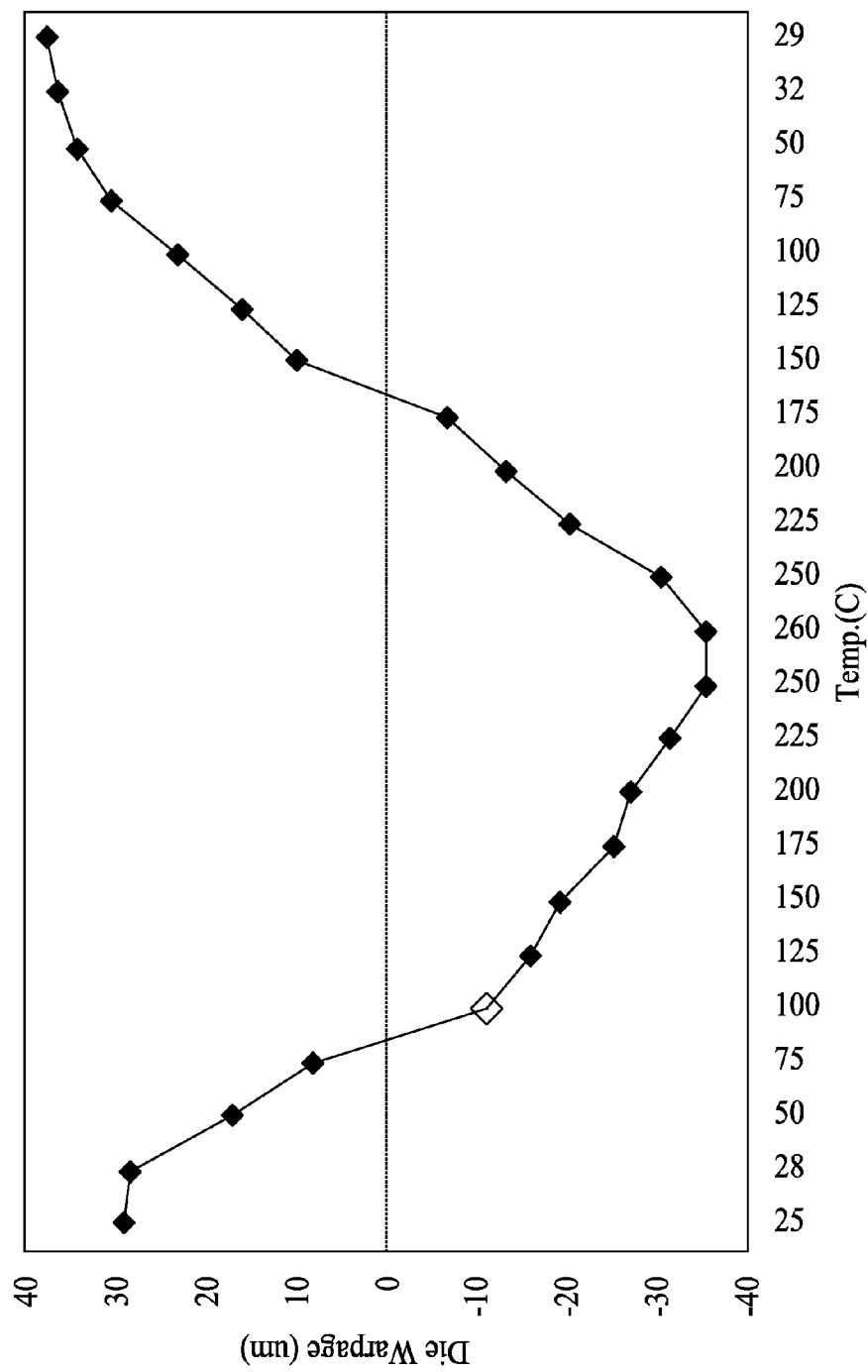
FIG. 9B shows die warpage values corresponding to various temperatures under a temperature cycle, in accordance with some embodiments of the present disclosure.

Referring to FIG. 9A and FIG. 9B, FIG. 9A shows a cross sectional view of a device die, and FIG. 9B shows die warpage values corresponding to various temperatures under a temperature cycle, in accordance with some embodiments of the present disclosure. FIG. 9A and FIG. 9B further discuss the operation 701 determining a die warpage value under a predetermined temperature range. As shown in FIG. 9A, the device die 50 includes, but not limited to, a silicon substrate 1013, a metallization layer 1015, a passivation layer 1017, a conductive pad 1019, a metal bump 103, and solder materials 109. In some embodiments, the warpage value of the device die 50 is measured under a temperature cycle shown in FIG. 9B by ramping the temperature from about room temperature to a predetermined temperature, for example, the reflow temperature. It is shown that around the reflow temperature (about from 240 to about 270 degrees Celsius), the die warpage becomes a negative value. The negative warpage value of the device die is then a predetermined warpage value to be matched by the carrier substrate.

Figure 10A:
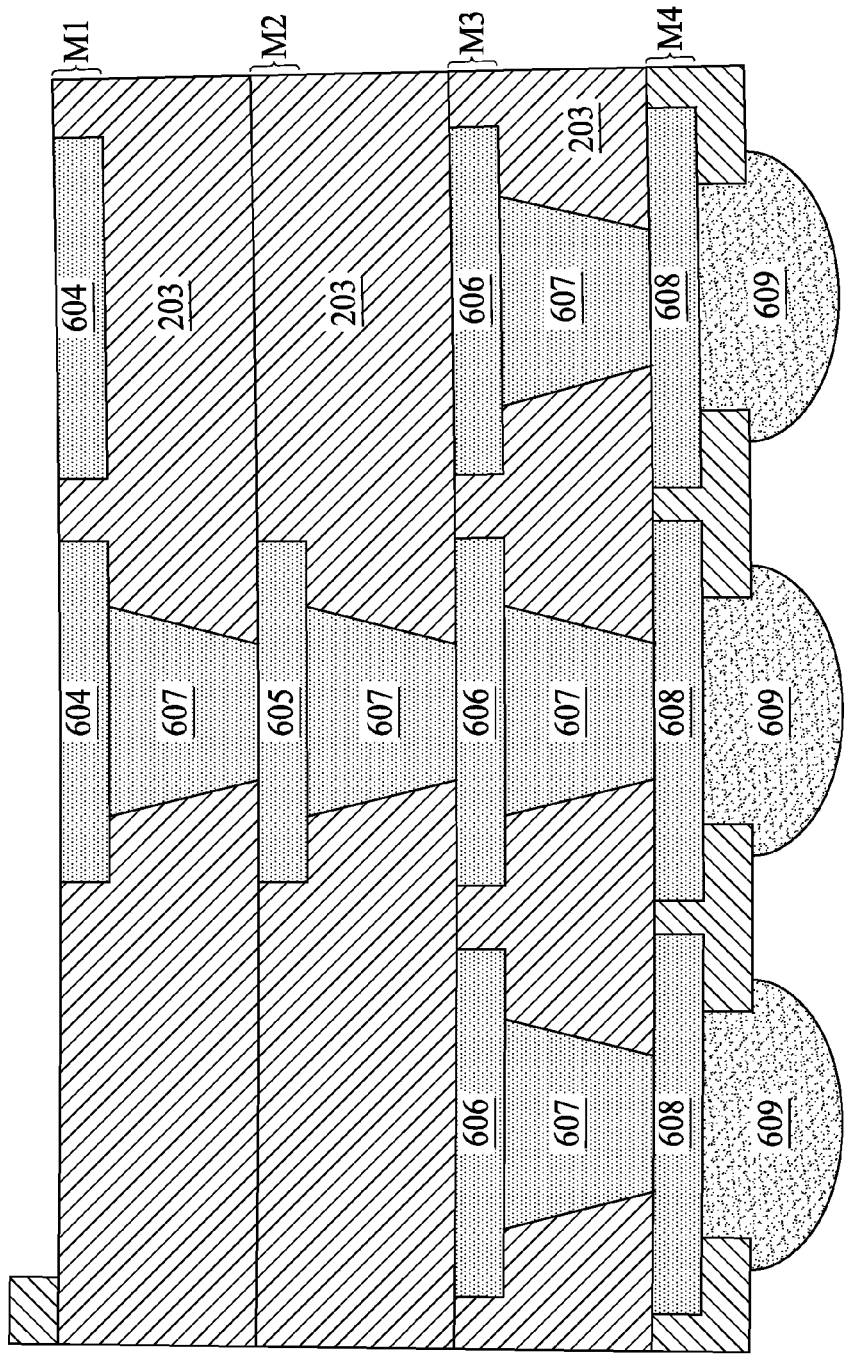
FIG. 10A shows a cross sectional view of a carrier substrate, in accordance with some embodiments of the present disclosure.
Figure 10B:
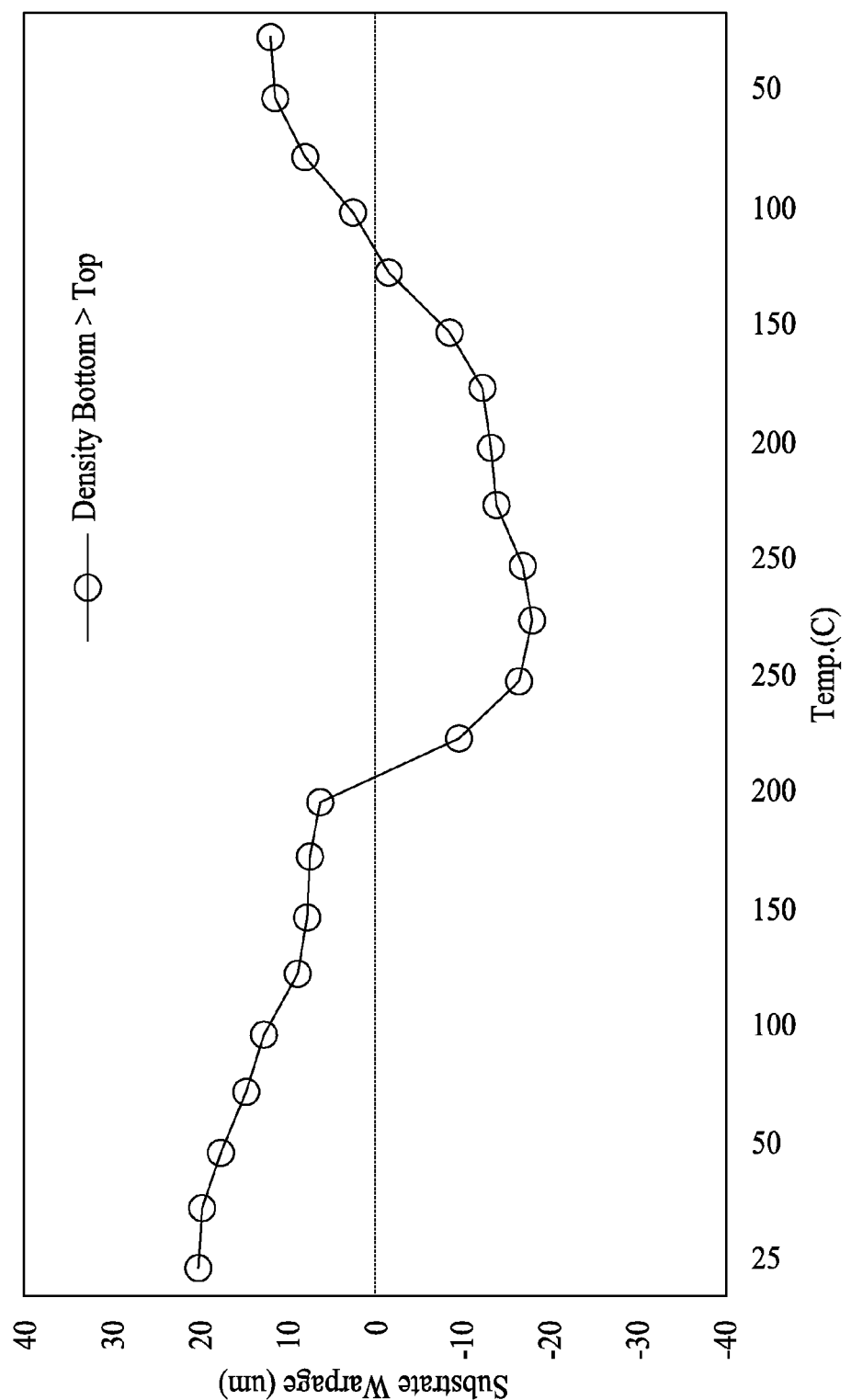
FIG. 10B shows carrier substrate warpage values corresponding to various temperatures under a temperature cycle, in accordance with some embodiments of the present disclosure.

Referring to FIG. 10A and FIG. 10B, FIG. 10A shows a cross sectional view of a carrier substrate 60, and FIG. 10B shows carrier substrate warpage values corresponding to various temperatures under a temperature cycle, in accordance with some embodiments of the present disclosure. FIG. 10A and FIG. 10B further discuss the operation 702 determining the difference between a density of a top metal and a density of a bottom metal of a carrier substrate. As shown in FIG. 10A, the carrier substrate 60 includes, but not limited to, metal layers M1, M2, M3, M4, vias 607 connecting different metal layers, dielectric layer 203, and planted solder ball 609. In some embodiments, the warpage value of the carrier substrate 60 is measured or simulated under a temperature cycle shown in FIG. 10B by ramping the temperature from about room temperature to a predetermined temperature, for example, the reflow temperature. It is shown that around the reflow temperature (about from 240 to about 270 degrees Celsius), the carrier substrate warpage becomes a negative value when the bottom metal density is greater than the top metal density. The negative warpage convention is identical to that of the device die. In an alternative embodiment, the warpage value of the carrier substrate around the reflow temperature can be tuned to match the warpage value of the device die around the reflow temperature by adjusting the density difference, as discussed previously in FIG. 8.

Figure 11A:
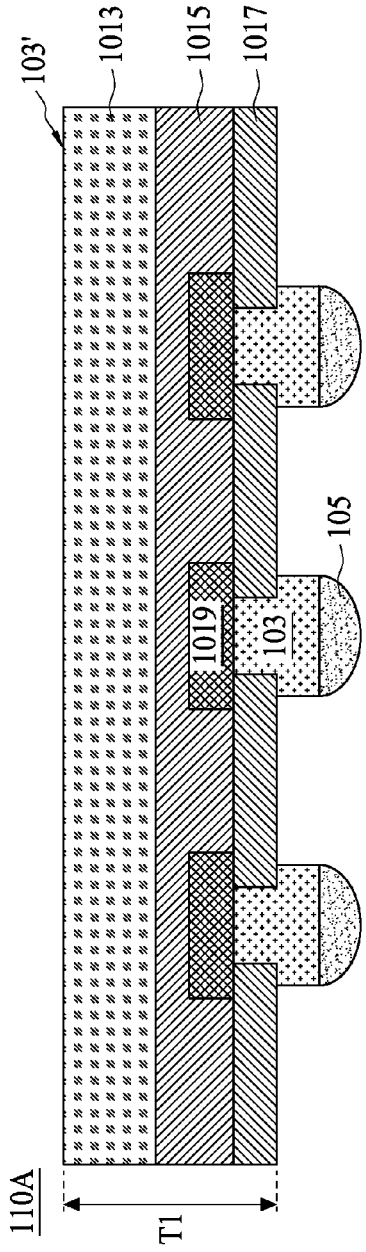
FIGS. 11A, 11B, 12A, 12B, 13-14 show fragmental illustration of cross sectional views of various operations of a method for manufacturing a semiconductor package, in accordance with some embodiments of the present disclosure.
Figure 11B:
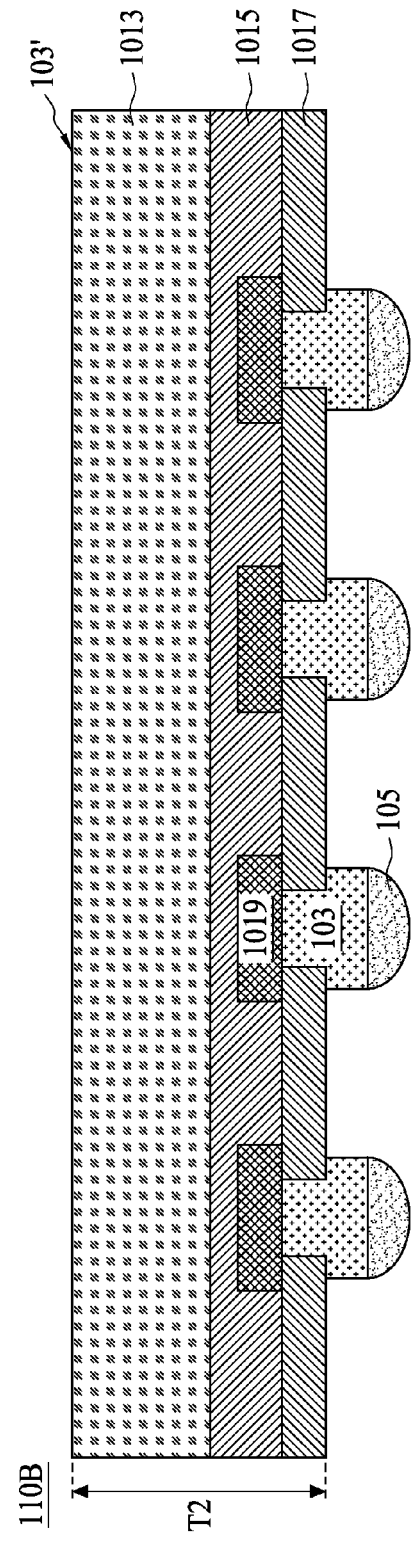

FIGS. 11A, 11B, 12A, 12B, 13-14 show fragmental illustration of cross sectional views of various operations of a method for manufacturing a semiconductor package, in accordance with some embodiments of the present disclosure. FIG. 11A and FIG. 11B are two device dies 110A, 110B with different thicknesses and die areas. Numeral labels in FIG. 11A and FIG. 11B that are identical to those in FIG. 1 are referred to the same object or its equivalent, and are not repeated here for simplicity. Prior to joining the device die to the carrier substrate, the warpage of the device die is not as pronounced as that of the device die undergoes reflow operation. The first curvature, or the first warpage of the device die referred herein is the warpage under a predetermined temperature, for example, the reflow temperature. For device die 110A, in some embodiments, a thickness T1 thereof can be 4 mil, whereas a thickness T2 of the device die 110B can be 8 mil. In addition, the die area of the device die 110A is about 100 mm$^2$, and the die area of the device die 110B is about 1.44 mm$^2$. In other embodiments, the die area of the device die 110A is about 169 mm$^2$, and the die area of the device die 110B is about 196 mm$^2$.

Figure 12A:
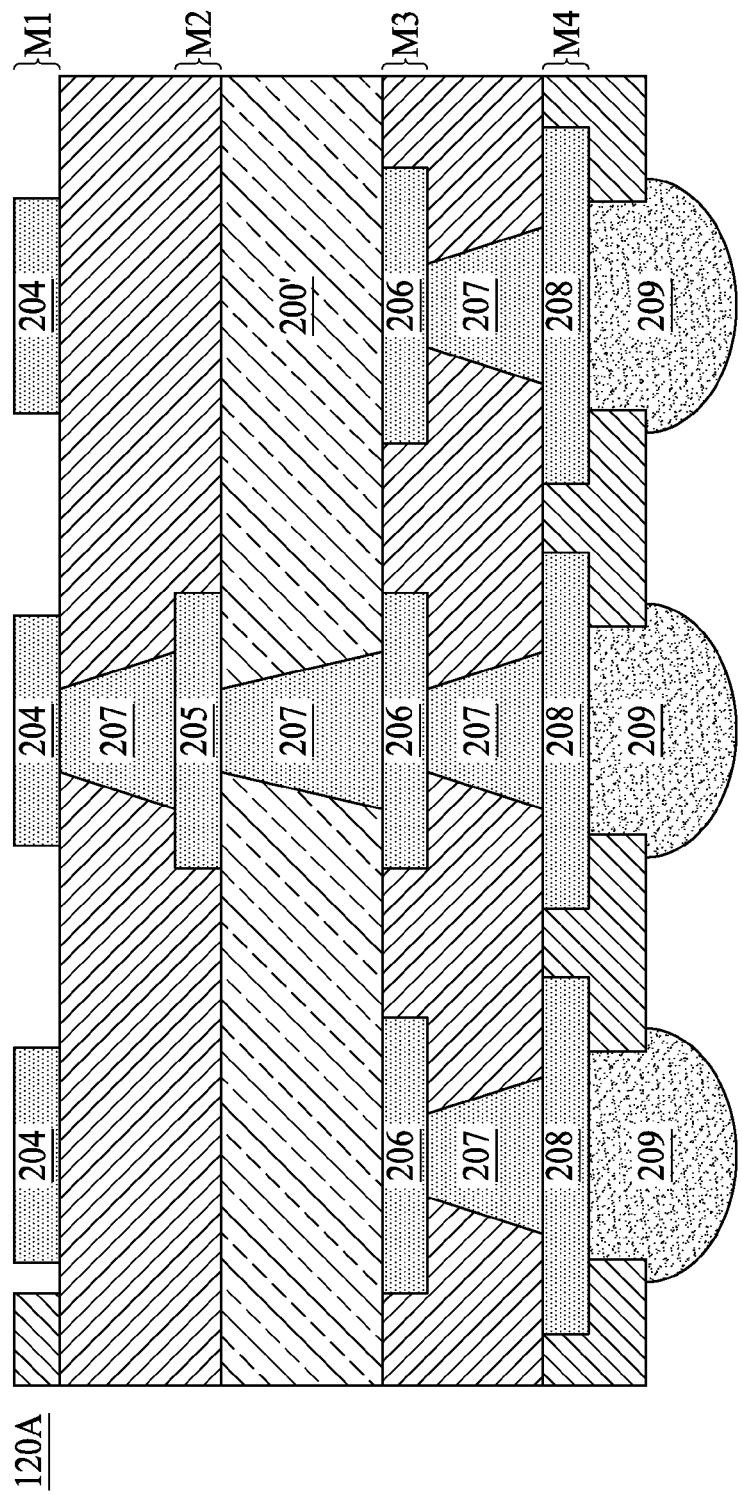
Figure 12B:
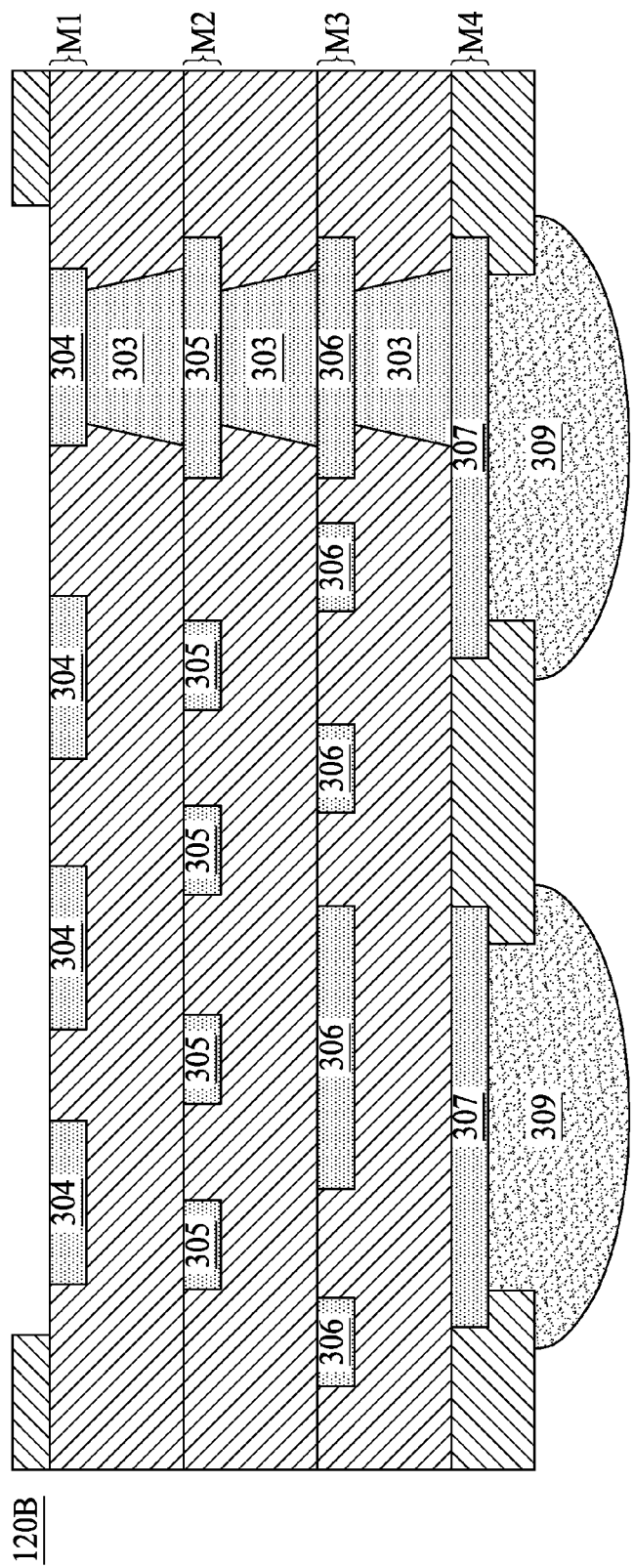

FIG. 12A and FIG. 12B are two carrier substrate 120A and 120B with different metal structures, for example, carrier substrate 120A is a SAP substrate having a core layer 200', and carrier substrate 120B is an even-layered EPP substrate. Numeral labels in FIG. 12A and FIG. 12B that are identical to those in FIG. 3 and FIG. 4 are referred to the same object or its equivalent, and are not repeated here for simplicity. Prior to joining the device die to the carrier substrate, the warpage of the carrier substrate is not as pronounced as that of the device die undergoes reflow operation. The second curvature, or the second warpage of the carrier substrate referred herein is the warpage under a predetermined temperature, for example, the reflow temperature. As discussed previously, the first curvature of the device die and the second curvature of the carrier substrate possess a same sign convention.

Figure 13:
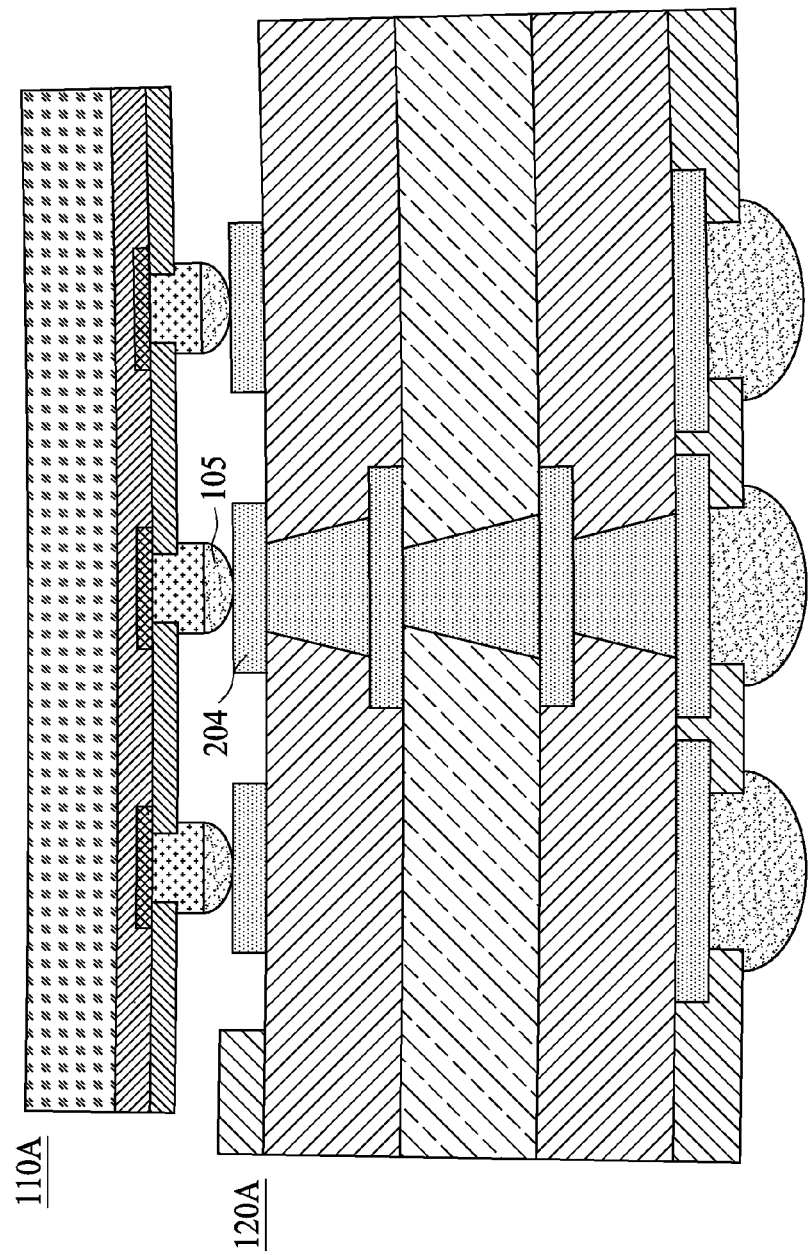
Figure 14:
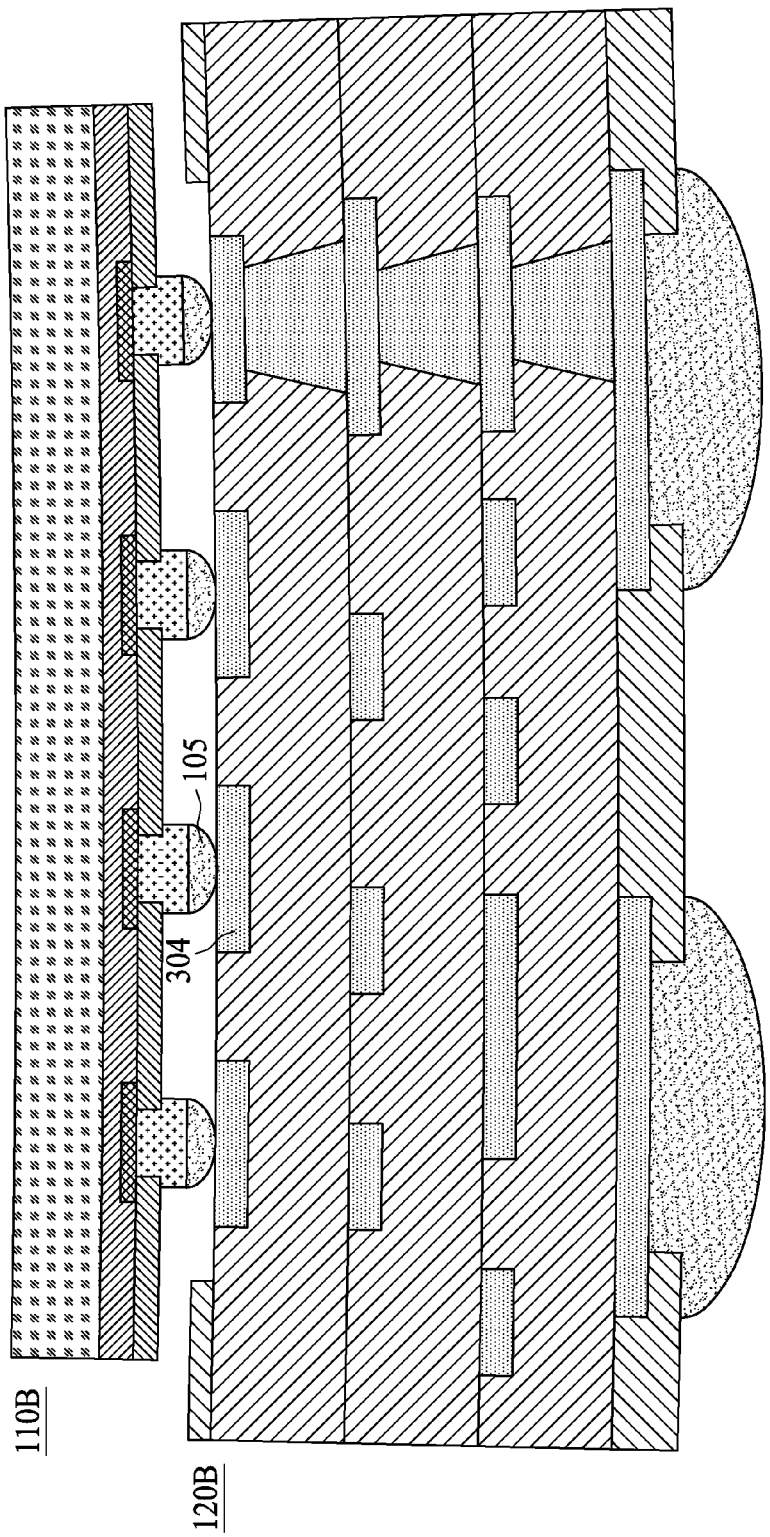

In FIG. 13, the device die 110A and the carrier substrate 120A are combined through a bump-on-trace (BOT) boding. The device die 110A and the carrier substrate 120A are joined by inciting the solder materials 109 on the metal bumps 103, and joined the metal bumps 103 with the conductive traces 204 of the first metal layer M1. During a reflow operation, both the device die 110A and the carrier substrate 120A are curved with a same sign convention, for example, the warpage behavior is concave in both the carrier substrate 120A and the device die 110A. In some embodiments, the density difference of the carrier substrate 120A is about 13.4%. Similarly, in FIG. 14, the device die 110B and the carrier substrate 1209 are combined through a bump-on-trace (BOT) boding. During a reflow operation, both the device die 110A and the carrier substrate 120A are curved with a same sign convention, for example, the warpage behavior is concave in both the carrier substrate 120A and the device die 110A. In some embodiments, the density difference of the carrier substrate 120A is about 10.3%. In some embodiments, a difference between the top metal density and the bottom metal density is greater than about 8%.

Figure 15:
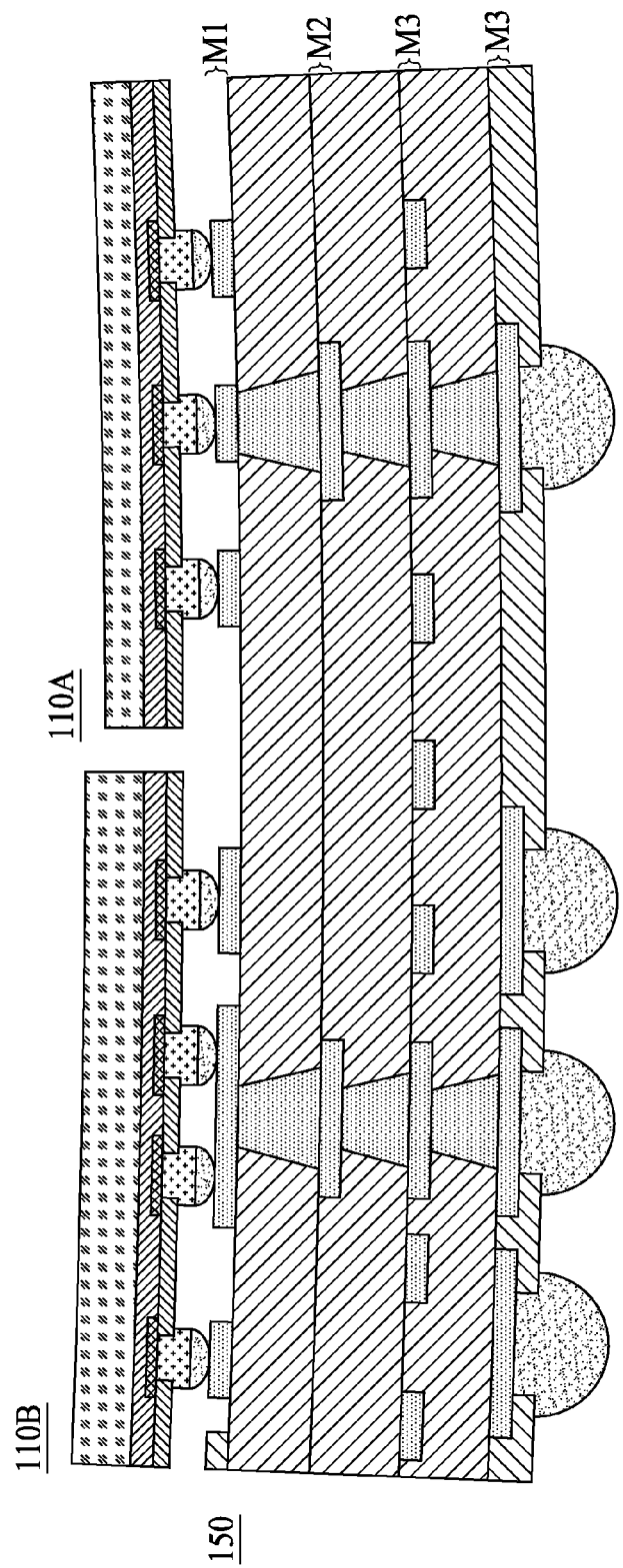
FIG. 15 shows a cross sectional view of a semiconductor package, in accordance with some embodiments of the present disclosure.

FIG. 15 shows a cross sectional view of a semiconductor package, in accordance with some embodiments of the present disclosure. In FIG. 15, both device dies 110A and 110B are joined to a carrier substrate 150 through a reflow operation. In some embodiments, the second curvature of the device die 150 is calculated not only based on the first curvature of the device die 110B, but also the first curvature of the device die 110A.

Some embodiments of the present disclosure provide a semiconductor package, including (1) a substrate with a first warpage, and (2) a device die over the substrate, having a second warpage and a surface area greater than about 100 mm$^2$. The first warpage and the second warpage comprise a same warpage sign convention and a substantially identical warpage value.

In some embodiments of the present disclosure, the substrate of the semiconductor package includes a middle layer, a top metal, and a bottom metal. The top metal overlays the middle layer. All the metal layers overlying the middle layer have a top metal density that is about an average of densities of all the metal layers over the middle layer. The bottom metal underlays the middle layer. All the metal layers underlying the middle layer have a bottom metal density that is about an average of densities of all the metal layers under the middle layer. The bottom metal density is greater than the top metal density.

In some embodiments of the present disclosure, a difference between the top metal density and the bottom metal density is at least about 0.08.

In some embodiments of the present disclosure, a thickness of the device die is less than about 10 mil.

In some embodiments of the present disclosure, the substrate of the semiconductor package includes a core, a top metal, and a bottom metal. The top metal having j metal layers overlays the core. The top metal includes a top metal density about a sum of densities of j metal layers divided by j. The bottom metal having k metal layers underlays the core. The bottom metal includes a bottom metal density about a sum of densities of k metal layers divided by k. j and k are positive integers.

In some embodiments of the present disclosure, the substrate has n metal layers arranged from a top to a bottom of the substrate. The n metal layers have a top metal including 1 to n/2 metal layers, wherein a top metal density of the top metal is about a sum of densities of each of the 1 to n/2 metal layers divided by n/2. The n metal layers have a bottom metal including (n/2+1) to n metal layer, wherein a bottom metal density of the bottom metal is about a sum of densities of each of the (n/2+1) to n metal layers divided by n/2. n is a positive integer.

In some embodiments of the present disclosure, the substrate has m metal layers arranged from a top to a bottom of the substrate. The m metal layers have a top metal including 1 to (m−1)/2 metal layers, wherein a top metal density of the top metal is about a sum of densities of each of the 1 to (m−1)/2 metal layers divided by (m−1)/2. The m metal layers have a bottom metal including (m+3/2) to m metal layer, wherein a bottom metal density of the bottom metal is about a sum of densities of each of the (m+3/2) to m metal layers divided by (m−1)/2. m is a positive integer.

In some embodiments of the present disclosure, the surface area of the device die is greater than 1.44 mm$^2$.

Some embodiments of the present disclosure provide a method for manufacturing a semiconductor package. The method includes (1) determining a die warpage value under a predetermined temperature range; (2) determining a difference between a density of a top metal and a density of a bottom metal of a substrate according to the die warpage value; and (3) joining the die and the substrate under the predetermined temperature range. The top metal includes all metal layers overlying a middle layer, and the bottom metal includes all metal layers underlying the middle layer. The middle layer includes a core or a metal layer.

In some embodiments of the present disclosure, the determining the difference between the density of the top metal and the density of the bottom metal includes subtracting the density of the bottom metal by the density of the top metal. The density of the top metal is about an average of areal densities of all the metal layers of the top metal. The density of the bottom metal is about an average of areal densities of all the metal layers of the bottom metal.

In some embodiments of the present disclosure, a surface area of the die is greater than about 100 mm$^2$.

In some embodiments of the present disclosure, the determining the die warpage value includes measuring the warpage of a die having semiconductor, metal layer, dielectric layer, and metal bump under a temperature cycle from about room temperature to about the predetermined temperature range.

In some embodiments of the present disclosure, the determining the difference between the density of the top metal and the density of the bottom metal includes a simulation operation correlating the difference and the die warpage value.

In some embodiments of the present disclosure, the predetermined temperature range is between about 240 to about 270 degrees Celsius.

Some embodiments of the present disclosure provide a method for manufacturing a semiconductor package. The method includes (1) providing a semiconductor die having a first curvature under a predetermined temperature; (2) providing a substrate having a second curvature under the predetermined temperature; and (3) combining the semiconductor die and the substrate through Bump-On-Trace (BOT) bonding. The first curvature and the second curvature have a same sign convention.

In some embodiments of the present disclosure, the providing the substrate having a second curvature includes designing a metal density difference between a top metal and a bottom metal of the substrate.

In some embodiments of the present disclosure, the metal density of the bottom metal is greater than the metal density of the top metal by at least about 0.08.

In some embodiments of the present disclosure, the first curvature and the second curvature are both in a concave shape.

In some embodiments of the present disclosure, a surface area of the semiconductor die is greater than about 100 mm$^2$.

In some embodiments of the present disclosure, the substrate includes a semi-additive process (SAP) substrate, an embedded pattern plating (EPP) substrate, or combinations thereof.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a substrate with a first warpage, the substrate comprising:
a middle layer;
a top metal overlying the middle layer, the top metal comprising:
a top metal trace horizontally patterned at a same height level; and
a top metal vias vertically connecting to the top metal trace; and
a bottom metal underlying the middle layer, the bottom metal comprising:
a bottom metal trace horizontally patterned at a same level; and
a bottom metal vias vertically connecting to the bottom metal trace,
wherein a bottom metal density is greater than a top metal density so as to achieve the first warpage, the bottom metal density being an areal ratio between the bottom metal trace and a size of the semiconductor package from a top view perspective, the top metal density being an areal ratio between the top metal trace and the size of the semiconductor package from a top view perspective; and
a device die over the substrate, having a second warpage and a surface area greater than about 100 mm$^2$,
wherein the top metal trace of the substrate is directly connected to a metal bump of the device die through a solder, and
wherein warpage sign convention and warpage value for the first and second warpage are substantially identical before and after directly connecting the substrate and the device die.

2. The semiconductor package of claim 1, wherein a difference between the top metal density and the bottom metal density is at least about 0.08.

3. The semiconductor package of claim 1, wherein a thickness of the device die is less than about 10 mil.

4. The semiconductor package of claim 1, wherein the substrate has n metal layers arranged from a top to a bottom of the substrate, comprising:
a top metal including 1 to n/2 metal layers, wherein a top metal density of the top metal is about a sum of densities of each of the 1 to n/2 metal layers divided by n/2; and
a bottom metal including (n/2+1) to n metal layer, wherein a bottom metal density of the bottom metal is about a sum of densities of each of the (n/2+1) to n metal layers divided by n/2;
wherein n is a positive integer.

5. The semiconductor package of claim 1, wherein the substrate has m metal layers arranged from a top to a bottom of the substrate, comprising:
a top metal including 1 to (m−1)/2 metal layers, wherein a top metal density of the top metal is about a sum of densities of each of the 1 to (m−1)/2 metal layers divided by (m−1)/2; and
a bottom metal including (m+3/2) to m metal layer, wherein a bottom metal density of the bottom metal is about a sum of densities of each of the (m+3/2) to m metal layers divided by (m−1)/2;
wherein m is a positive integer.

6. The semiconductor package of claim 1, wherein the surface area of the device die is greater than 144 mm$^2$.

7. A semiconductor package, comprising:
a substrate with a first warpage, the substrate comprising:
a core;
a top metal having j metal layers overlying the core, the top metal comprising a top metal density about a sum of densities of j metal layers divided by j, each of the j metal layers comprising:
a top metal trace horizontally patterned at a same height level; and
a top metal vias vertically connecting to the top metal trace; and
a bottom metal having k metal layers underlying the core, the bottom metal comprising a bottom metal density about a sum of densities of k metal layers divided by k, each of the k metal layers comprising:
a bottom metal trace horizontally patterned at a same height level; and
a bottom metal vias vertically connecting to the bottom metal trace, wherein j and k are positive integers, and a bottom metal density is greater than a top metal density so as to achieve the first warpage, the bottom metal density being an areal ratio between the bottom metal trace and a size of the semiconductor package from a top view perspective, the top metal density being an areal ratio between the top metal trace and the size of the semiconductor package from a top view perspective; and a device die over the substrate, having a second warpage, wherein the top metal of the substrate is directly connected to a metal bump of the device die through a solder, wherein warpage sign convention and warpage value for the first and second warpage are substantially identical before and after directly connecting the substrate and the device die.

8. The semiconductor package of claim 7, wherein the top metal is closer to the device die than the bottom metal.

9. The semiconductor package of claim 7, wherein a difference between the top metal density and the bottom metal density is at least about 0.08.

10. The semiconductor package of claim 7, wherein a thickness of the device die is less than about 10 mil.

11. The semiconductor package of claim 7, wherein the device die has a surface area greater than about 100 mm$^2$.

12. The semiconductor package of claim 7, wherein the device die has a surface area greater than about 144 mm$^2$.

13. The semiconductor package of claim 7, wherein the device die and the substrate are joined through a Bump-On-Trace (BOT) bonding.

14. The semiconductor package of claim 7, wherein the core comprises epoxy, resin, glass fiber, molding compound, plastic, and combinations thereof.

15. A semiconductor package, comprising:
 a substrate with a first warpage, comprising:
  a middle layer;
  a top metal overlying the middle layer, the top metal comprising:
   a top metal trace horizontally patterned at a same height level; and
   a top metal vias vertically connecting to the top metal trace, and
  a bottom metal underlying the middle layer, the bottom metal comprising:
   a bottom metal trace horizontally patterned at a same level; and
   a bottom metal vias vertically connecting to the bottom metal trace,
   wherein a bottom metal density is greater than a top metal density so as to achieve the first warpage, the bottom metal density being an areal ratio between the bottom metal trace and a size of the semiconductor package from a top view perspective, the top metal density being an areal ratio between the top metal trace and the size of the semiconductor package from a top view perspective; and
 a device die over the substrate, having a second warpage and connecting with the top metal trace of the substrate through a solder,
 wherein warpage sign convention and warpage value for the first and second warpage are substantially identical before and after directly connecting the substrate and the device die.

16. The semiconductor package of claim 15, wherein the bottom metal density is greater than the top metal density by at least about 0.08.

17. The semiconductor package of claim 15, wherein the first curvature and the second curvature are both in a concave shape.

18. The semiconductor package of claim 15, wherein a surface area of the device die is greater than about 100 mm$^2$.

19. The semiconductor package of claim 15, wherein a thickness of the device die is less than about 10 mil.

20. The semiconductor package of claim 15, wherein the substrate comprises a semi-additive process (SAP) substrate, an embedded pattern plating (EPP) substrate, or combinations thereof.

* * * * *